United States Patent
Zhou et al.

(10) Patent No.: US 8,885,395 B2
(45) Date of Patent: Nov. 11, 2014

(54) MAGNETORESISTIVE LOGIC CELL AND METHOD OF USE

(75) Inventors: Yuchen Zhou, San Jose, CA (US); Zihui Wang, Fremont, CA (US); Yiming Huai, Pleasanton, CA (US); Rajiv Yadav Ranjan, San Jose, CA (US); Roger K. Malmhall, San Jose, CA (US)

(73) Assignee: Avalanche Technology, Inc., Fremont, CA (US)

(*) Notice: Subject to any disclaimer, the term of this patent is extended or adjusted under 35 U.S.C. 154(b) by 331 days.

(21) Appl. No.: 13/402,123

(22) Filed: Feb. 22, 2012

(65) Prior Publication Data
US 2013/0215672 A1   Aug. 22, 2013

(51) Int. Cl.
*G11C 11/00*   (2006.01)

(52) U.S. Cl.
CPC ............. *G11C 11/00* (2013.01); *Y10S 977/933* (2013.01); *Y10S 977/935* (2013.01)
USPC ........... 365/158; 365/148; 365/171; 365/173; 977/933; 977/935

(58) Field of Classification Search
CPC ....................................................... G11C 11/00
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| 7,075,807    | B2 * | 7/2006  | Leuschner et al. | ............... 365/48 |
| 2006/0038211 | A1 * | 2/2006  | Leuschner et al. | ............ 257/295 |
| 2011/0303998 | A1   | 12/2011 | Ranjan et al.    |                     |

OTHER PUBLICATIONS

Wei-GangWang, Mingen Li, Stephen Hageman and C. L. Chien,"Electric-field-assisted switching in magnetic tunnel junctions", Nature Materials vol. 11, 64-68 (2012).
S. Ikeda, et.al.,"A perpendicular-anisotropy CoFeB—MgO magnetic tunnel junction", Nature Materials vol. 9, 721-724 (2010).
T. Aoki1, et.al.,"Fabrication of MgO-based magnetic tunnel junctions for subnanosecond spin transfer switching", Journal of Physics: Conference Series 266, 012086 (2011).
P. Padhan, et.al.,"Frequency-dependent magnetoresistance and magnetocapacitance", Appl. Phys. Lett. 90, 142105 (2007).
J Wrona, et.al.,"Low resistance magnetic tunnel junctions with MgO wedgebarrier", Journal of Physics: Conference Series 200, 052032 (2010).

* cited by examiner

*Primary Examiner* — Harry W Byrne
(74) *Attorney, Agent, or Firm* — G. Marlin Knight; Bing K. Yen

(57) ABSTRACT

A magnetoresistive logic cell (MRLC) is described that includes two MTJs in series that share a common free layer (CFL). The relative magnetization orientations of the CFL and the switchable reference layer (SRL) in MTJ-1 dominate the overall resistance of the MRLC without regard to the fixed magnetization orientation of the nonswitchable reference layer in MTJ-2. The high resistance state of the MRLC occurs when the switchable reference and common free layers have opposite magnetization orientations. The low resistance state occurs when the orientations are the same. This behavior allows the MRLC to be used as a logical comparator. The CFL is switched by STT effect by application of selected relatively short voltage pulses that do not switch the SRL. The SRL is switched with reference to the CFL by a voltage effect generated by a selected longer voltage pulse that does not switch the CFL.

6 Claims, 12 Drawing Sheets

MAGNETORESISTIVE LOGIC CELL AND METHOD OF USE

FIELD OF THE INVENTION

The present invention relates to the design and use of magnetoresistive random access memory (MRAM) cells that include magnetic tunnel junctions (MTJ) memory elements.

BACKGROUND OF THE INVENTION

FIG. 1 illustrates an MRAM cell 10P with MTJ 200P in which the easy axes of the magnetic layers are perpendicular to the plane of the thin films as illustrated by the arrows on the magnetic layers 15, 13, 11. MTJs can also be designed with in-plane magnetization. An MRAM cell structure typically includes a top metal contact and a bottom metal contact. The metal contacts are also referred to as electrodes.

A typical STT-MRAM (spin transfer torque magnetic random access memory) MTJ (magnetic tunnel junction) stack has a reference layer 13 whose magnetization is fixed in a certain direction by either intrinsic anisotropy field, or through an exchange coupling field from an adjacent pinned magnetic layer. In the example shown in FIG. 1 reference layer 13 is antiferromatically coupled through AF-coupling layer 14 to the pinned layer 15. The MTJ also has a switchable free magnetic layer 11, whose magnetization direction can be switched relative to that of the reference layer 13 by an electric current flowing between the reference layer and free layer through a junction layer 12, typically an oxide of Mg, Al and Ti, or a metallic layer of Cu, Au, or Ag. The different relative angles between free layer and reference layer magnetization directions gives different resistance levels across the MTJ stack. The free magnetic layer has a magnetization direction that is switchable in either of two directions. The resistivity of the whole MTJ layer stack changes when the magnetization of the free layer changes direction relative to that of the reference layer, exhibiting a low resistance state when the magnetization orientation of the two ferromagnetic layers is substantially parallel and a high resistance when they are anti-parallel. Therefore, the cells have two stable states that allow the cells to serve as non-volatile memory elements.

Reading the state of the cell is achieved by detecting whether the electrical resistance of the cell is in the high or low state. Writing the cells requires a sufficiently high DC current flowing in the direction through the MTJ stack between the top and bottom metal contacts to induce a spin transfer torque (STT) that orients (switches) the free layer into the desired direction. The amount of current needed to write the cells is at least slightly higher than the current that flows during the read process, so that a read operation does not change the state of the cell.

A recent study by Wang, et al. on perpendicular MTJ shows that the perpendicular anisotropy of magnetic layers in MgO based MTJ structures can be changed by the voltage applied to the magnetic layers. See Wei-Gang Wang, et al., "Electric-field-assisted switching in magnetic tunnel junctions", Nature Materials Vol. 11, 64-68 (2012).

Wang, et al. used an example MTJ layer structure (which is illustrated in FIG. 2 herein) of bottom magnetic layer 43 CoFeB (1.3 nm), MgO layer 42 (1.4 nm), and top magnetic layer 41 CoFeB (1.6 nm). In the test setup as shown a small positive DC electric potential is applied to the MTJ cell to drive electrons into the bottom magnetic layer. When MgO layer 42 is thick enough and resistance across the MgO junction is high enough, the current density through the MgO junction will be low. In this case, the two magnetic layers adjacent to the MgO layer form a capacitor across the MgO layer, which is fundamentally the same as a classic parallel-plate capacitor with the MgO layer as the dielectric between the parallel plates. When a voltage is applied to the MgO junction, electrical charges will accumulate in the two magnetic layers, which is governed by the capacitor equation of $Q = C \times V$, where Q is the net charge, C the capacitance and V the applied voltage. The applied positive voltage as shown in FIG. 2 causes the top magnetic layer to have a positive potential, i.e. electron depletion at the top layer's interface to the MgO layer. Wang's graph (reproduced in FIG. 3 herein) shows the coercivity field Hc for the top and bottom layers as a function of the electric field. The perpendicular anisotropy is reflected by the measured coercivity field Hc. With increasing applied voltage and electron depletion at the top layer's interface to the MgO layer, the top magnetic layer shows increased perpendicular anisotropy. The layer that has negative potential (the bottom layer in this example) and, therefore, electron concentration at the layer's interface to MgO, shows decreased perpendicular anisotropy.

When voltage is applied to an MgO junction having effective capacitance, the magnetic layer having a negative voltage potential will have net negative charges, which are basically conductive electrons, accumulated at its interface with the MgO layer. For the magnetic layer having positive potential, the positive charges at its interface with MgO are basically vacancies of conductive electrons that are depleted by the applied voltage. Unlike a standard capacitor, in an MgO/magnetic junction acting as a capacitor the electrons at the magnetic layers' interfaces also affect the magnetic anisotropy in those layers. The Wang article cited above as well as the Ikeda, et. al. article show that surface perpendicular anisotropy of CoFeB layer on the junction with the MgO layer is intrinsically due to the broken-symmetry of the interface CoFe lattice of the CoFeB layer facing the MgO layer. See S. Ikeda, et. al., "A perpendicular-anisotropy CoFeB—MgO magnetic tunnel junction", Nature Materials Vol. 9, 721-724 (2010).

In a perfectly symmetric and continuous lattice of CoFe, the electron-to-electron spin exchange coupling between the unpaired 3d-electrons, which are also the conductive electrons, of Co and Fe atoms cancel out each other's effect and produce zero anisotropy energy in a symmetric and continuous lattice. However, at the interface of the CoFeB layer and MgO layer, the CoFeB layer's interface is actually CoFe facing MgO. MgO breaks the symmetry of the CoFe lattice, so that the 3d-electrons of Co and Fe atoms at the interface lose their cancellation-counter-part and create a net anisotropy energy that produces an effective anisotropy field perpendicular to the interface plane. Thus, the originally soft magnetic CoFeB film can exhibit strong perpendicular anisotropy on the sides of the MgO and show hard magnetic behavior.

Wang, et al. show that with applied voltage, the magnetic layer that has a positive potential, i.e. electron depletion at the layer's interface to MgO, shows increased perpendicular anisotropy. The magnetic layer that has negative potential, i.e. electron concentration at the layer's interface to MgO, shows decreased perpendicular anisotropy. A possible cause of such behavior can be that the magnetic layer having increased electrons will have more conductive electrons filling in the 3d-band of the interface CoFe lattice and reducing the unpaired 3d-electron population. This makes the broken-symmetry induced surface perpendicular anisotropy weaker, and thus makes the magnetic layer magnetically softer. When 3d-electrons are depleted in a magnetic layer, electrons will be depleted first from paired 3d-electrons due to Hund's Rules. More 3d-electrons becoming unpaired enhances the surface perpendicular anisotropy and makes the layer magnetically harder to switch by external field or spin transfer torque (STT).

Capacitance of MgO based magnetic tunnel junctions (MTJs) will be discussed next. For an MTJ with resistance-area (RA) product of 100 $\Omega\mu m^2$ or less, which is a common value for MTJ used in conventional MRAM cells, the barrier layer is thin enough to allow a higher density of electron current to tunnel through the barrier and results in effective resistance of a patterned MTJ stack within a few hundreds to a few thousand ohms. However, due to this low RA and high current density, when a voltage is applied to the MTJ, charges (accumulated and depleted electrons) will not be held within the magnetic layers adjacent to the barrier layer to provide a capacitive effect. The MTJ acts more like a conductor as the charges leak to the other side of the barrier layer due to the voltage potential. Therefore, the capacitance of low RA MTJ patterned stacks is generally very low. Prior study by Aoki, et. al. shows that for an RA=5.5 $\Omega\mu m^2$ MTJ stack with an MgO barrier, the capacitance of a 100 nm×200 nm size patterned MTJ cell, including contribution from the larger top and bottom leads, is only 14 femtofarads (fF). For the capacitance from the magnetic layers and MgO barrier, it is only a few fF. See T. Aoki, et. al., "Fabrication of MgO-based magnetic tunnel junctions for subnanosecond spin transfer switching", Journal of Physics: Conference Series 266, 012086 (2011).

However, for MTJ with RA of 10 k $\Omega\mu m^2$ or higher, at MgO thickness of 2 nm or thicker, the tunneling current density is much lower so that charges can accumulate in the magnetic layers adjacent to the MgO barrier and thereby form an effective capacitor. Prior study by Padhan, et. al. shows that MTJ effective capacitance has an inverse linear trend versus MgO thickness. See P. Padhan, et. al., "Frequency-dependent magnetoresistance and magnetocapacitance", Appl. Phys. Lett. 90, 142105 (2007) and FIG. 4 herein. The inset in FIG. 4 shows Padhan's RC circuit equivalent of the MTJ with a series combination of an interface capacitance $C_i$ and a bulk capacitance C from the MgO. For example, at MgO layer thickness (tMgO)=2.5 nm, with RA ~100 k $\Omega\mu m^2$, area/C is about 0.005 $cm^2$/pF. From Wrona, et al., for MTJ with RA ~10 $\Omega\mu m^2$, critical dimension (CD)=65 nm, effective capacitance is only ~1 fF, with tMgO ~1.0 nm.

Also from Padhan, et. al., A/C versus tMgO trend indicates that at certain thickness between 2.0 nm~2.5 nm, NC can be very close to 0 but still be a positive value, meaning effective C can be relatively high. From the trend line of Padhan, et. al., A/C ~0.0006 at tMgO ~2.44 nm, where RA ~100 k $\Omega\mu m^2$. At CD=65 nm, effective capacitance is ~0.13 pF.

For STT-MRAM to provide distinctive resistance state changes, the simple design with a fixed reference layer and switchable free layer suffices for the purpose. However, if reference layer magnetization could also be switched under certain conditions, while staying un-perturbed during conditions that switch the free layer, then the STT-MRAM could be used as a more powerful logic element providing sophisticated logic functions than a simple data storage memory based on resistance-level.

SUMMARY OF THE INVENTION

Embodiments of the invention include a magnetoresistive thin film structure which has two magnetic layers with switchable magnetization direction and will be called a magnetoresistive logic cell (MRLC). The MRLC thin film structure uses MRAM MTJ technology based on STT induced magnetic switching, as well as voltage (or electric potential) induced magnetic switching. An MRLC can serve as a nonvolatile memory and/or a logic device.

An MRLC according to embodiments of the invention includes two MTJs in series with each MTJ sharing a common free layer (CFL). The other magnetic layer with a switchable orientation will be called a switchable reference layer (SRL) in MTJ-1. In addition there is at least one magnetic layer with a fixed orientation, which serves as a pinned layer in MTJ-2 and which will called the nonswitchable reference layer. The magnetic layers are arranged with the common free layer between the other magnetic layers and being separated by two nonmagnetic junction layers.

The relative magnetization orientations of the common free layer and the switchable reference layer in MTJ-1 dominate the overall resistance of the MRLC without regard to the fixed magnetization orientation of the nonswitchable reference layer in MTJ-2 which makes only a small contribution. This behavior is different from that of a standard MTJ in which the resistance is determined by the relative orientations of the free layer and the pinned layer. The high resistance state of the MRLC occurs when the switchable reference and common free layers have opposite magnetization orientations. The low resistance state occurs when the reference layer and free layer have the same magnetization orientation. This behavior allows the MRLC to be used as a logical comparator.

An MRLC according to the invention has MTJ-2 designed to have a substantially lower RA product MTJ junction than MTJ-1. MTJ-1 has an effective capacitance that is much larger than that of MTJ-2. Embodiments of the invention allow the CFL to be switched with reference to the nonswitchable reference layer by STT effect through application of selected relatively short voltage pulses that do not switch the SRL. The SRL can be switched with reference to the CFL by a voltage effect generated by a selected longer voltage pulse that does not switch the CFL.

The different methods of setting the common free layer (CFL) and the switchable reference layer (SRL) allow the SRL to serve as a long term data storage layer while the CFL serves for short term data storage. This allows a single MRLC device to serve as a fully functional logic cell, which usually requires a much more complicated and bulky circuitry when formed entirely by conventional CMOS circuits.

One example of a use of the MRLC is as a comparator logic cell, where data bits "1" and "0" can be stored as the two opposite magnetization orientations in the SRL and CFL. A logical comparison operation can be performed using a series of MRLCs by storing a first data bit sequence in the switchable reference layers (SRLs) and then storing a second data sequence in the same MRLCs' common free layers (CFL). The comparison result is then read back in the high/low resistance states of the set of MRLCs. The high resistance state means the SRL and CFL have opposite magnetization orientations and therefore, that the corresponding bits in the two sequences are not equal. Similarly the low resistance state means the corresponding bits are the same. Two identical data sequences, for example, will place the series of MRLCs all in the low resistance state, which can be taken as either all "0" or all "1" and giving an effective logic of XOR or XNOR.

DETAILED DESCRIPTION OF THE INVENTION

In the following description of the embodiments of the invention, reference is made to the accompanying drawings that form a part hereof. The figures discussed herein are not drawn to scale and do not indicate actual or relative sizes. The hatching in the figures does not represent the type of material used.

A general first MRLC 50 embodiment of the invention will be described with reference to FIG. 5. From the top in FIG. 5 the sequence of layers is: top metal contact; switchable reference layer (SRL) 53; nonmagnetic junction layer 52; common free layer (CFL) 51; nonmagnetic junction layer 54; nonswitchable reference layer (NRL) 55; and bottom metal contact. As shown layers SRL 53, junction 52, and CFL 51 make up MTJ-1. CFL 51, junction 54, and NRL 55 make up MTJ-2. MTJ-1 and MTJ-2 share the common free layer (CFL) 51. The MTJ-1 and MTJ-2 are in series and the current flow is between top and bottom metal contacts. This layer structure can be used in embodiments with either perpendicular or in-plane anisotropy. As used herein, the corresponding layers in a perpendicular anisotropy embodiment will have a "P" suffix in the reference number, as follows SRL 53P; junction layer 52P; CFL 51P; junction layer 54P; and NRL 55P. Similarly the corresponding layers in an in-plane anisotropy embodiment will have an "H" suffix in the reference number, as follows SRL 53H; junction layer 52H; CFL 51H; junction layer 54H; and NRL 55H. In MRLC embodiments which will be described below, additional layers are added between the NRL 55 and the bottom contact that enhance the fixed/pinned field in the structure, but the principles of operation of an MRLC are fundamentally the same in each embodiment.

In embodiments of the invention MTJ-1 is designed to have a higher $RA_1$ product MTJ junction than MTJ-2. Junction layer 52 can be, for example, an oxide of Mg, Al or Ti, with thickness of 1 nm or thicker. Other possible materials for junction layer 52 will be discussed below.

MTJ-2 is designed to have a lower RA product MTJ junction preferably with $RA_2 \leq 10\%$ of the $RA_1$ of MTJ-1. Junction layer 54 is, for example, an oxide of Mg, Al or Ti, with thickness less than that of junction layer 52. Other possible materials for junction layer 54 will be discussed below. The result of the MRLC layer structure designed according to the invention is that MTJ-1 has an effective capacitance that is much larger than that of MTJ-2.

Figure 1:
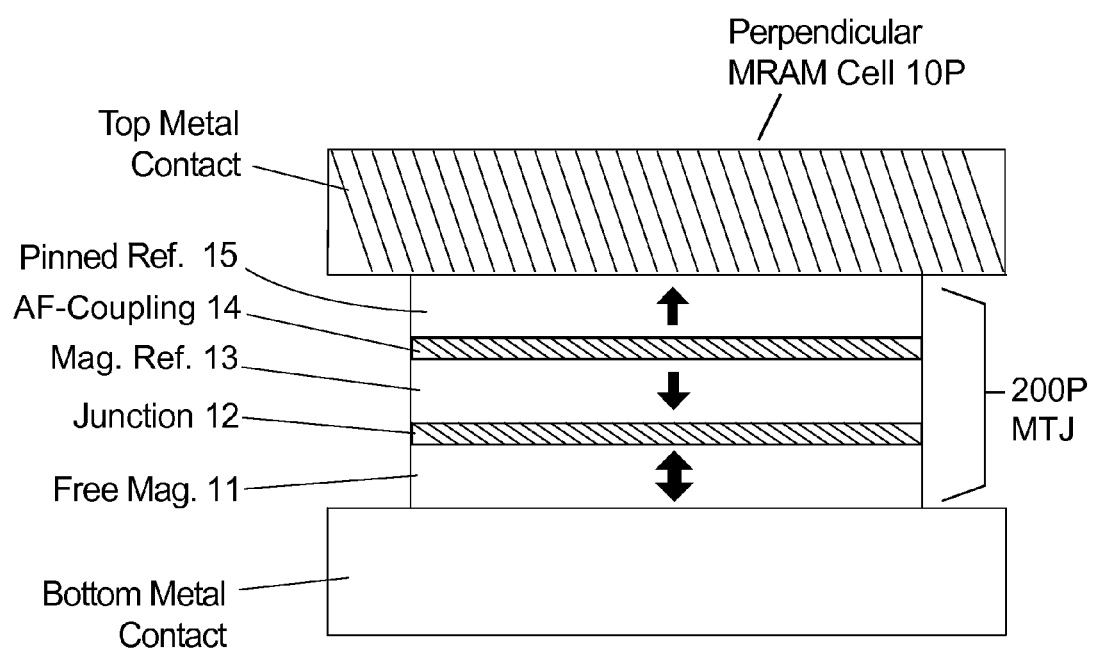
FIG. 1 is an illustration of a prior art MRAM cell including MTJ memory element designed for perpendicular magnetization.
Figure 2:
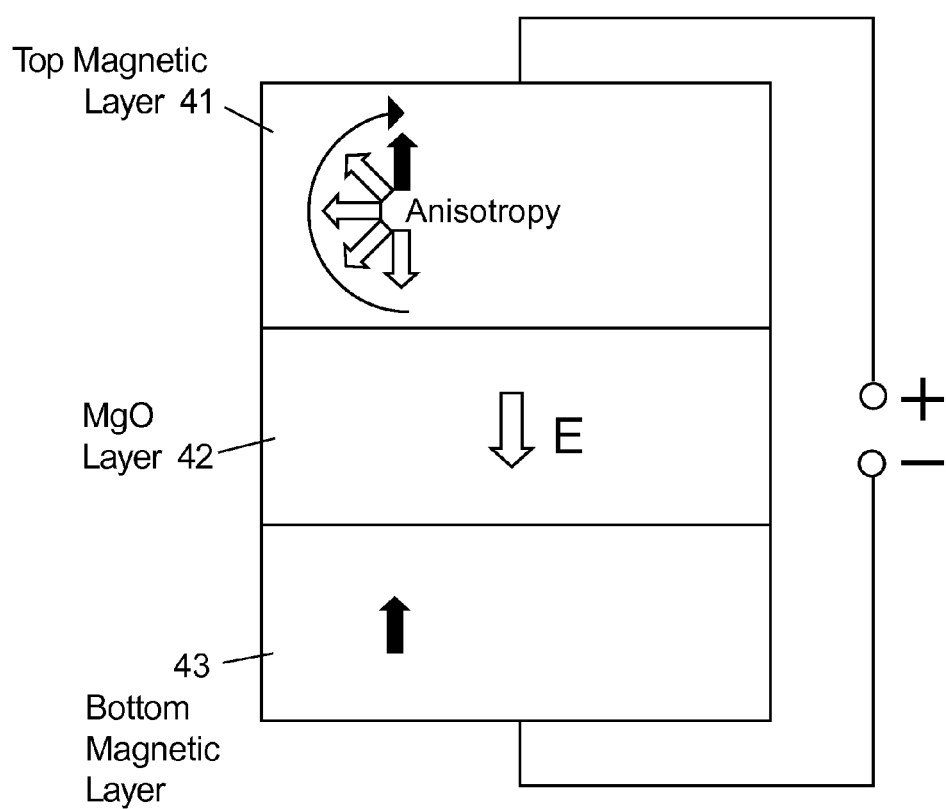
FIG. 2 is an illustration of an MTJ layer structure used in a prior art experiment.
Figure 3:
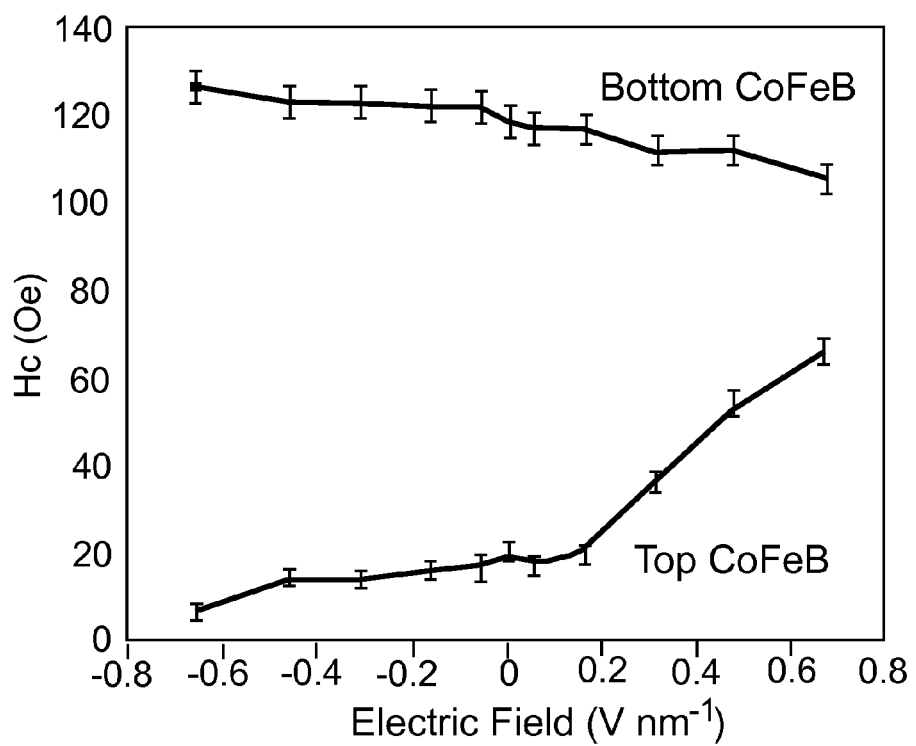
FIG. 3 is a graph of the results of a prior art experiment using the MTJ layer structure of FIG. 2.
Figure 4:
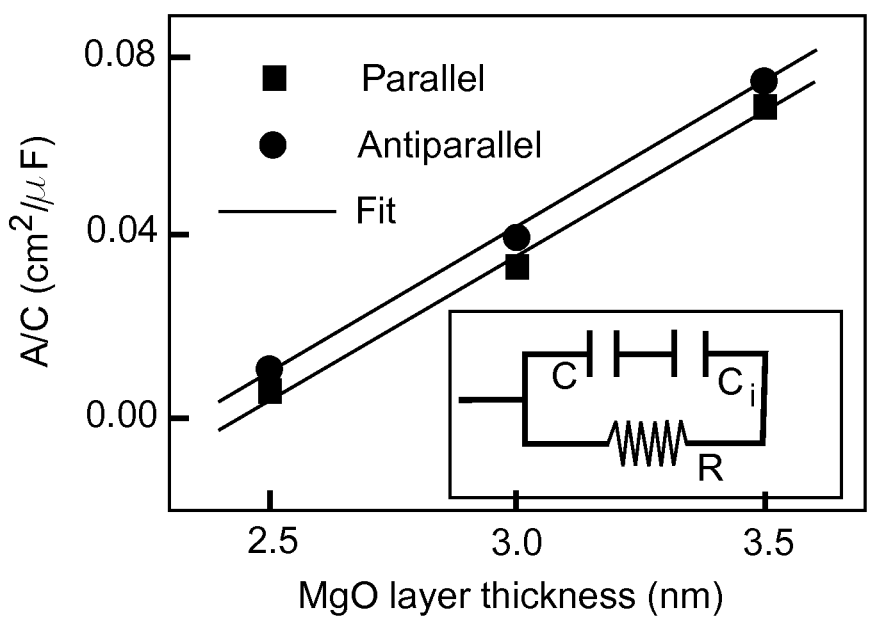
FIG. 4 is a graph of the results of a prior art experiment showing area/capacitance ratio versus MgO junction layer thickness.
Figure 5:
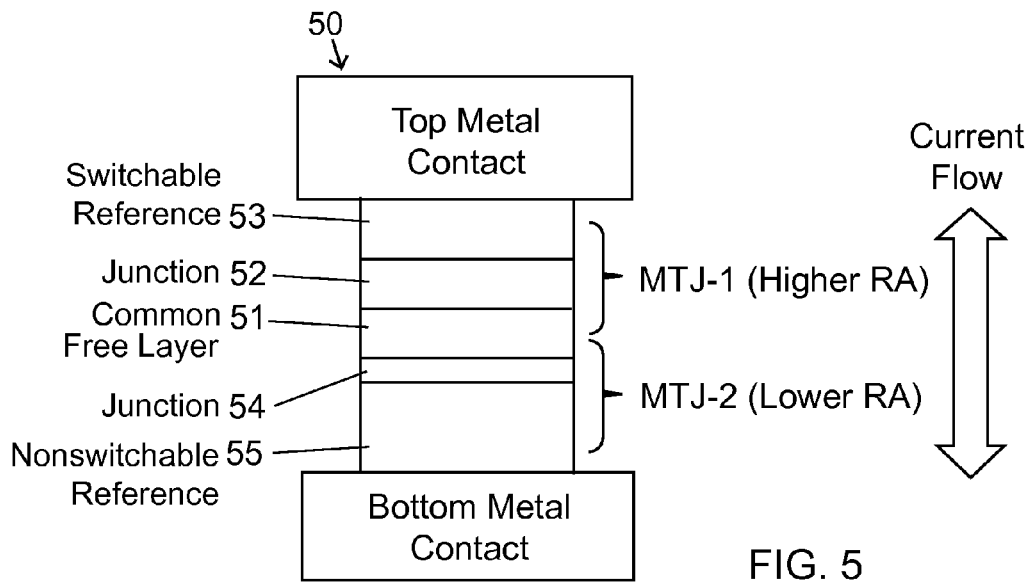
FIG. 5 illustrates the layer structure of an MRLC according to an embodiment of the invention.
Figure 6:
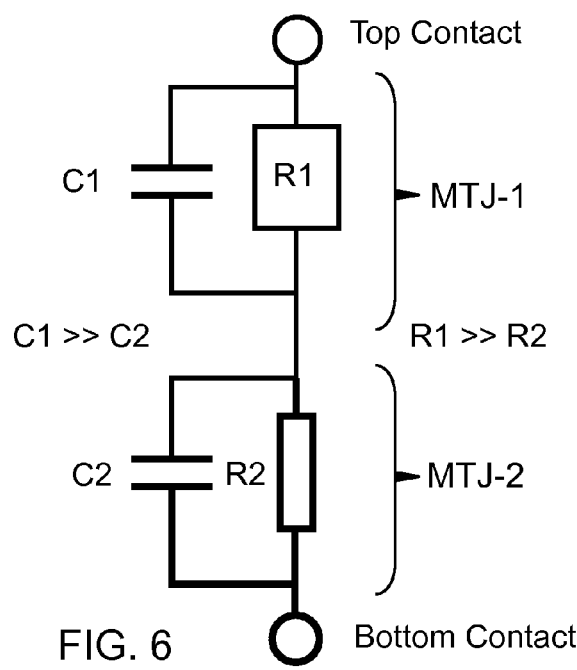
FIG. 6 shows an example of an RC circuit equivalent for the MTJ structure of FIG. 5 according to an embodiment of the invention.

FIG. 6 is an example of an RC circuit equivalent for the MTJ-1 and MTJ-2 layer stack of FIG. 5. This simple model can be used to explain the performance of the MRLC layer structure designed as described above. The model can be applied to high or low resistance states by changes in parameters. Most of the resistance change between states should come from the MTJ-1 which has a higher RA product and also has a much larger capacitance. For the invention, the critical case is when the resistance is in the low state, so that will be the assumption in the following discussion. MTJ-1 is shown as a capacitance C1 in parallel with resistance R1. MTJ-2 is shown as a capacitance C2 in parallel with resistance R2, with C1>>C2 and R1>>R2.

A short voltage pulse will act primarily on MTJ-2 which has the much lower RA product. (Note: The description of the operation of the MRLC will refer to voltage pulses, but appropriate current based pulses can be substituted to achieve equivalent effects.) The RC circuit shows that when a short pulse is applied to the structure through the contacts, C1 will shunt R1 during that pulse due to its large capacitance, and the applied pulse voltage (whether positive or negative) primarily shows up on MTJ-2. Using the known behavior of MTJs, this causes STT from nonswitchable reference layer 55 on common free layer (CFL) 51 which will switch CFL 51 according the polarity of the voltage pulse.

In contrast, in a perpendicular anisotropy embodiment when a high voltage long duration pulse (with slow rising and falling edges to avoid instantaneous high current in MTJ-2) is applied with negative polarity on switchable reference layer (SRL) 53P, electrons accumulate in the SRL 53P, and its perpendicular anisotropy is temporarily reduced as previously described. This allows the magnetization of SRL 53P to switch if necessary to be parallel to the magnetization of common free layer (CFL) 51P by action of a coupling field from CFL 51P on SRL 53P. In various embodiments the coupling field can be a magneto-static field, as well as, a ferromagnetic or an antiferromagnetic exchange coupling field. Once the voltage pulse ends the electron balance and the perpendicular anisotropy in SRL 53P return to the static levels in which the magnetization direction of the SRL 53P is stable in the presence of the coupling field. (Note: The in-plane anisotropy embodiment requires a long positive voltage pulse to set the SRL as explained below.)

Figure 7:
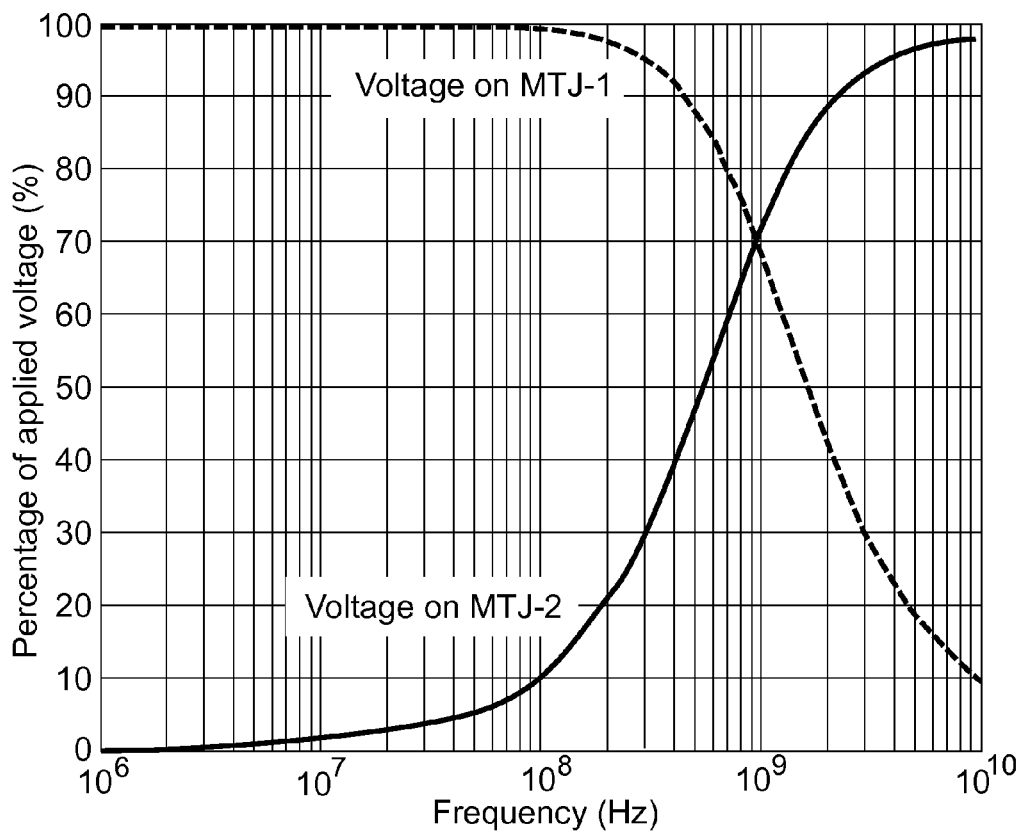
FIG. 7 is a graph which gives an example of the percentage of applied voltage on MTJ-1 and MTJ-2 in an MRLC according to an embodiment of the invention for a frequency range plotted on a logarithmic scale.

The switching process will be further explained using the graph shown in FIG. 7 which gives an example of the percentage of applied voltage on MTJ-1 and MTJ-2 for a frequency range from $10^6$ Hz to $10^{10}$ Hz plotted on a logarithmic scale. The total percentages do not always add up to 100%, because the voltages on the two MTJs will not necessarily be in the same phase at any instant time. At a given frequency of the plot, the drive voltage is basically a sinusoidal waveform with $V_0*\sin(\omega*t)$. The two plots are $V_1/V_0$ and $V_2/V_0$ at that frequency. Since $V_1$ and $V_2$ are varying with different phase, the instantaneous summation should equal to $V_0*\sin(\omega*t)$. The graph assumes the effective RC circuit of FIG. 6 and parameters of:

CD of MTJ stack=65 nm

MTJ-1 with MgO thickness ~2.44 nm, RA ~100 $\Omega\mu m^2$
    At CD=65 nm, R1 ~30 M$\Omega$, C1 ~0.13 pF.

MTJ-2 with MgO thickness ~1.0 nm, RA ~30 $\Omega\mu m^2$
    At CD=65 nm, R2 ~3 k$\Omega$, C2 ~1 fF.

The frequency response on MTJ-2 as modeled with these assumed parameters shows that for a voltage pulse that is less than 1 ns (frequency >1 GHz) more than 70% of the applied voltage drop will be on MTJ-2. Therefore, for MTJ-2, a short pulse with sufficient amplitude will switch the magnetization of the common free layer 51 by spin transfer torque (STT) from nonswitchable reference layer 55 through junction layer 54. However, this short pulse will not switch the magnetization of switchable reference layer 53.

In contrast the frequency response for MTJ-1 shows that a long pulse, with rise and fall time >10 ns, will make the voltage drop mainly appear on MTJ-1, while not creating current density that affects common free layer (CFL) 51 by STT from nonswitchable reference layer 55. Therefore, the magnetization of switchable reference layer 53 may be switched by a voltage effect from a long voltage pulse that does not switch common free layer 51. As will be explained further below, the polarity of the required long voltage pulse is positive for an in-plane anisotropy embodiment and negative for a perpendicular anisotropy embodiment. Whether the switchable reference layer 53 switches parallel or antiparallel to the CFL 51 depends on the coupling field in the particular embodiment. The four types of pulses described above can be summarized as:

1. short negative (SN) pulse switches CFL 51 to the first orientation;
2. short positive (SP) pulse switches CFL 51 to second orientation;
3. long negative (LN) pulse switches SRL 53P to parallel or antiparallel to CFL 51P depending on the coupling field; and
4. long positive (LP) pulse switches SRL 53H to parallel or antiparallel to CFL 51H depending on the coupling field.

A magnetoresistive logic cell (MRLC) 50 embodiment preferably has a resistance-area (RA) product of MTJ-1 that is at least 10× of the RA product of MTJ-2. The three magnetic layers 51, 53 and 55 in this embodiment can have easy magnetization axes perpendicular to or parallel to the film plane, but all of the layers should have the same easy axis direction. The entire structure can also be flipped upside down as an alternative embodiment.

Switching of Embodiment with Perpendicular Anisotropy

Figure 10:
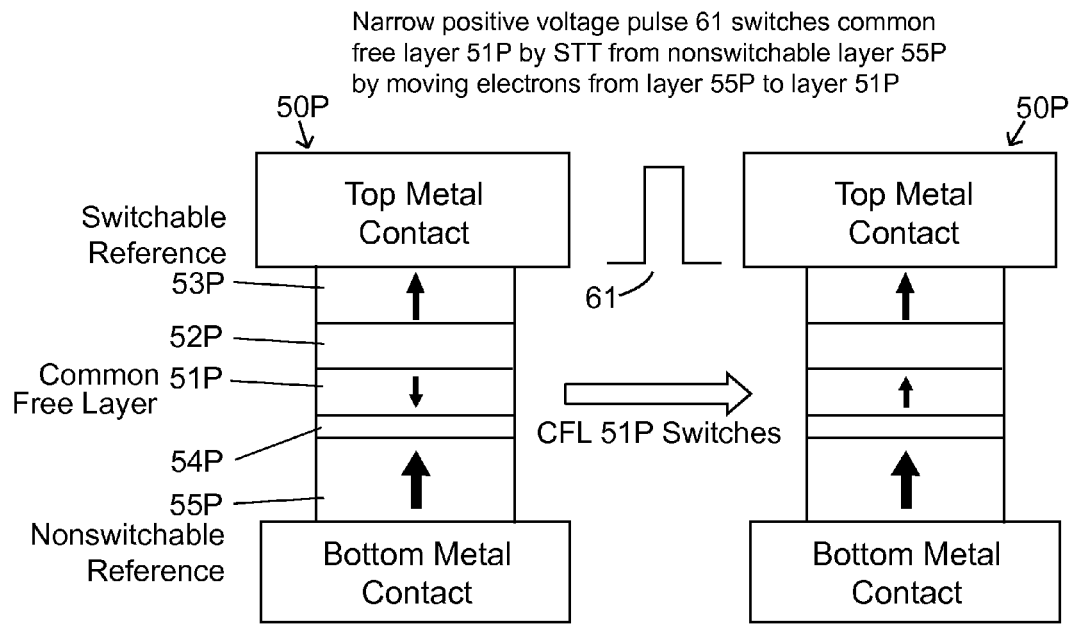
FIG. 10 illustrates a process of switching the common free layer using a short positive voltage pulse in an MRLC according to an embodiment of the invention.

The MRLC 50P in FIG. 10 has two magnetic layers with switchable orientations: common free layer (CFL) 51P and switchable reference layer (SRL) 53P. The techniques for switching these layers will now be further explained with reference to FIGS. 10-13. The magnetization of CFL layer 51P is independently switched by applying a selected voltage pulse, which is either a short positive (SP) or a short negative (SN) voltage pulse across the MRLC.

In FIG. 10 the initial state of MRLC 50P with perpendicular anisotropy is illustrated on the left with arrows representing the direction of magnetization of the layers. The nonswitchable reference layer (NRL) 55P has its arrow pointing up and the arrow for the common free layer (CFL) 51P is pointing down indicating that the magnetization of these layers is antiparallel. The switchable reference layer (SRL) 53P has its arrow pointing up. When the selected relatively short positive (SP) voltage pulse 61 is applied across the top and bottom contacts, electrons move from NRL 55P to CFL 51P and the magnetization of CFL 51P switches. The CFL arrow is now pointing up indicating that the magnetization of the CFL 51P layer is now parallel with that of NRL 55P. As indicated above the characteristics of required voltage pulse 61 are a function of the parameters of the MRLC 50P. For the parameter set described above, for example, the pulse is preferably less than 1 ns (frequency >1 GHz) and must have sufficient amplitude to switch the magnetization of the CFL 51P by spin transfer torque (STT) from NRL 55P through junction layer 54P. This short pulse will not switch the magnetization of SRL 53P, so its arrow is pointing up before and after the pulse is applied.

Figure 11:
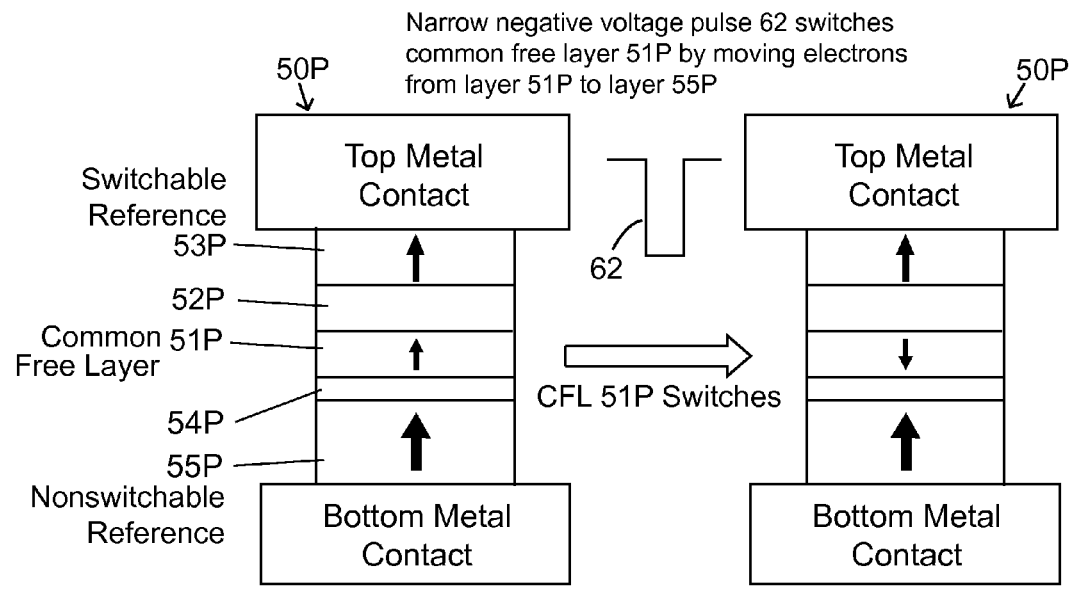
FIG. 11 illustrates a process of switching the common free layer (CFL) using a short negative voltage pulse in an MRLC according to an embodiment of the invention.

In FIG. 11 the initial state of magnetoresistive logic cell (MRLC) 50P is illustrated on the left is the same as the ending state shown on the right of FIG. 10 with all three arrows pointing up. When the selected short negative (SN) voltage pulse 62 is applied across the top and bottom contacts, the magnetization of common free layer (CFL) 51P switches so that its arrow is now pointing down indicating that the magnetization of the CFL 51P layers is now antiparallel with that of nonswitchable reference layer (NRL) 55P. A negative pulse moves electrons from CFL 51P to NRL 55P and spin transfer torque (STT) is applied from NRL 55P through junction layer 54P.

The foregoing explanation shows how the magnetization of common free layer (CFL) 51P is set by application of a short positive (SP) or a short negative (SN) voltage pulse. Next method of setting the magnetization of the switchable reference layer (SRL) 53P to be parallel to the magnetization of the CFL 51 will be described with reference to FIG. 12. The initial state of the MRLC 50P is shown on the left. Magnetizations of CFL 51P and SRL 53P are initially antiparallel as shown by their arrows pointing toward each other. FIG. 13 shows another initial state of the MRLC with the magnetization of CFL 51P and SRL 53P also antiparallel as indicated by the arrows pointing away from each other.

The MRLC 50P is designed so that under static conditions (with no applied voltage) and also with only short pulses, the perpendicular anisotropy in switchable reference layer (SRL) 53P is sufficient to resist the magneto-static or exchange coupling field from common free layer (CFL) 51P. Thus, under these conditions the magnetization of SRL 53P remains stable despite changes in the magnetization of CFL 51P.

However, the anisotropy in switchable reference layer (SRL) 53P is temporarily lowered by the application of a selected ramped, long negative (LN) voltage pulse 63. This LN pulse 63 is substantially longer and rises more gradually than the short negative (SN) pulse 62 used to set common free layer (CFL) 51P. For example, ramped LN voltage pulse 63 could have rise and fall time >10 ns, which will make the voltage drop mainly appear on MTJ-1. The selected LN pulse 63 will not create the current density to generate sufficient STT from nonswitchable reference layer 55P to switch CFL 51P. The amplitude of ramped LN voltage pulse 63 is relatively high. The negative voltage on the top contact causes electrons to accumulate at the interface of SRL 53P and 52P. This causes perpendicular anisotropy in SRL 53P to decline as described previously. By selecting appropriate design parameters, the reduction in anisotropy will be large enough to allow the coupling field from CFL 51P (for example magneto-static field) to cause SRL 53P to switch to parallel the direction of the coupling field, which is same direction of the magnetization of CFL 51P for magneto-static coupling. When the voltage reduces to 0 after the pulse ends, the perpendicular anisotropy in SRL 53$p$ returns (increases) to the static level which stabilizes (fixes) the new magnetization direction. As long as the anisotropy in SRL 53P remains sufficiently high, subsequent changes in direction of the coupling field will not cause switching. Therefore, the magnetization of SRL 53P may be switched to parallel that of CFL 51P by a long, slowly rising negative (LN) voltage pulse that does not switch CFL 51P. Subsequent short pulses that do switch CFL 51P will not switch SRL 53P.

Logic Operation of Embodiment with Perpendicular Anisotropy

Figure 16:
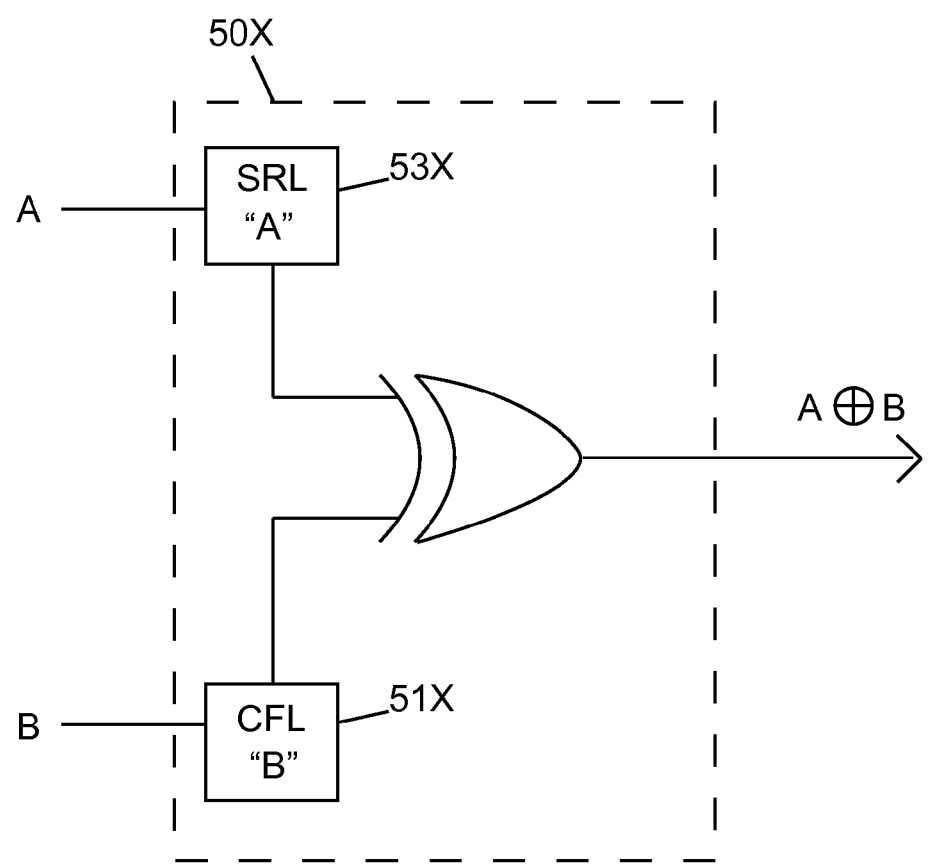
FIG. 16 illustrates the logical XOR function of an MRLC according to an embodiment the invention.

The use of an MRLC 50P for a logic operation will now be described. FIG. 16 illustrates the logical XOR function block 50X representing an MRLC according to an embodiment the invention. The data bit "A" is loaded in the symbolic SRL 53X, and the data bit "B" is loaded in the symbolic CFL 51X. The logical output is (A XOR B).

To implement the logical operation, the two magnetization orientations of the common free layer 51 and the switchable reference layer 53 are each mapped to data bits "0" and "1." The way that the orientations are mapped is not critical, but parallel orientations should preferably have the same mapped value. It follows from the switching operations described above that a data bit for the switchable reference layer (SRL) 53P must be set (written) to the common free layer (CFL) 51P first and then copied (relayed) into the SRL. Therefore, the first step is to write the data bit targeted for the SRL 53P into the CFL by a short positive (SP) or short negative (SP) voltage pulse as illustrated in FIGS. 10 and 11. For example, a SP pulse could be mapped to a "1" and a SN pulse could be mapped to a "0."

Figure 12:
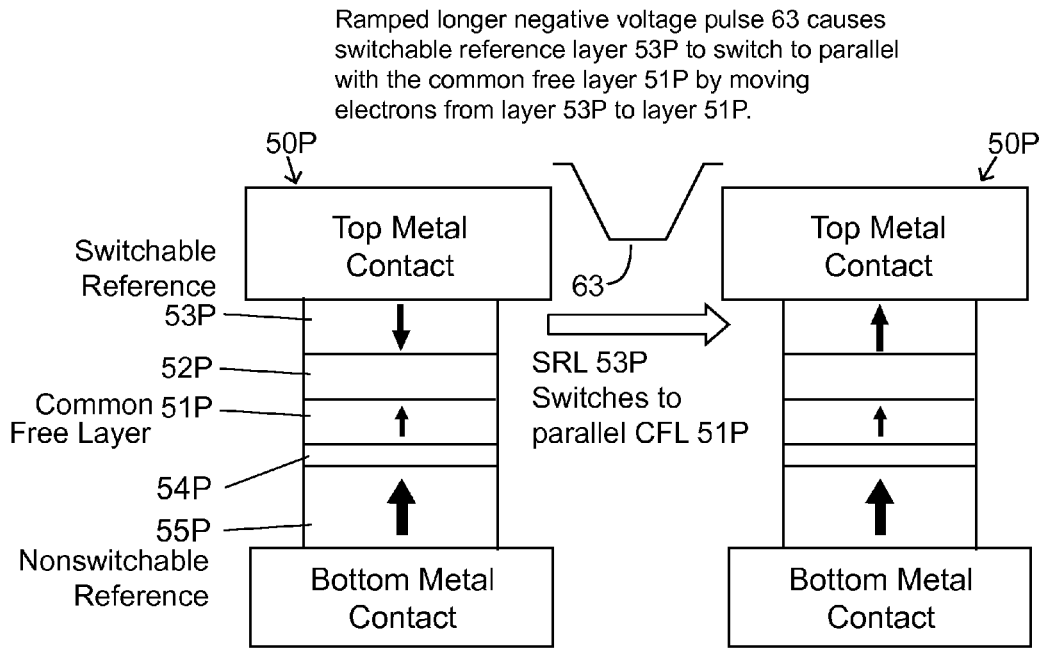
FIGS. 12 and 13 illustrate a process of switching the switchable reference layer (SRL) to parallel the common free layer (CFL) using a longer ramped negative voltage pulse in an MRLC according to an embodiment of the invention.
Figure 13:
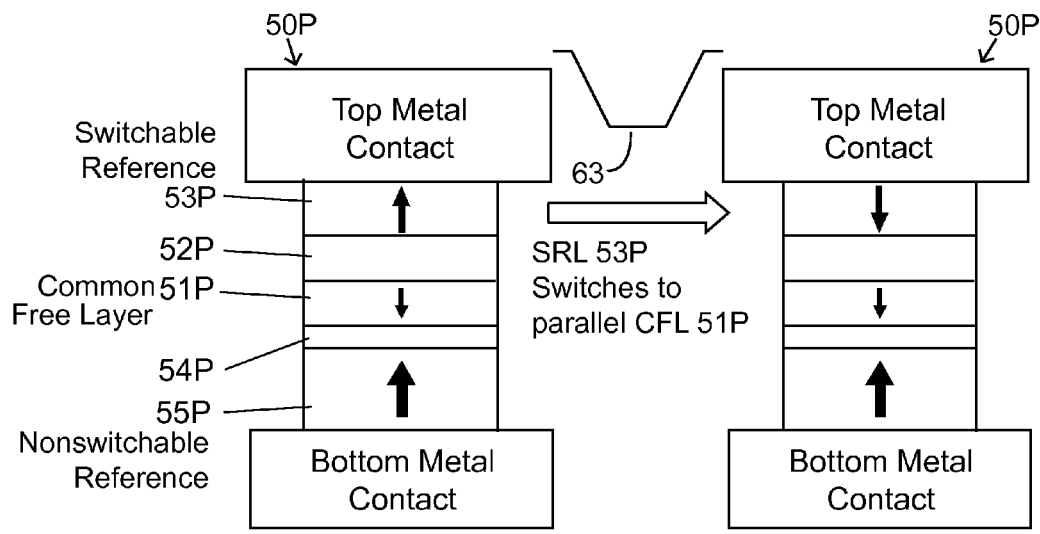

The second step copies the data bit in common free layer (CFL) 51P to switchable reference layer (SRL) 53P with a ramped, long negative (LN) voltage pulse 63 as illustrated in FIGS. 12 and 13. SRL 53P switches due to coupling field from CFL 51P. For normal perpendicular-MTJ, if the coupling field is mainly ferromagnetic type magneto-static coupling, SRL 53P switches to parallel the orientation of CFL 51P. The data bit copy is then a direct copy. In an alternative embodiment SRL 53P and CFL 51P can be anti-ferromagnetically coupled and, therefore, SRL 53P will switch anti-parallel to CFL 51P. In this alternative embodiment the data bit copy is then a "NOT" operation and the inputs are adjusted accordingly.

The third step is to write a second data bit to common free layer 51P with an SP or SN pulse.

After writing the two data bits, the state of the MRLC 50P can be read from the electrical resistance of the MRLC in the same way that the resistance of a standard MTJ is read, i.e. by applying a properly selected voltage/current pulse (read-pulse). A read-pulse does not alter either common free layer 51P or switchable reference layer 53P. For example, an appropriate pulse for reading should have rise/fall time greater than the short pulse width used to set CFL 51P.

Because MTJ-1 has a much higher RA than MTJ-2, the overall resistance of the MRLC is dominated by the contribution of MTJ-1. Therefore, the read-pulse is primarily reading the resistance of MTJ-1. The result is that two distinct levels of resistance (low & high) will exist for MRLC 50P depending on the magnetization (i.e. data content) of common free layer (CFL) 51P and switchable reference layer (SRL) 53P. The low resistance state, which exists when the two magnetizations are the same, means that the data bits are same, either both 0 or both 1. The high resistance state means the data bits are opposite, either 0 and 1, or 1 and 0.

In this example the MRLC acts as a comparator logic cell, where data bits "1" and "0" are stored as the two opposite magnetization orientations in the SRL and CFL. A multi-bit logical comparison operation can be performed by first writing each bit of a first data sequence in a switchable reference layer (SRL) in a linked set of MRLCs, and then writing each bit of a second data sequence in the corresponding common free layer (CFL) of the same set of MRLCs. The bit-by-bit comparison result is then read back in the high/low resistance states of the set of MRLCs. The high resistance state means the SRL and CFL have opposite magnetization orientations and therefore, that the corresponding bits in the two sequences are not equal. Similarly the low resistance state means the corresponding bits are the same. Two identical data sequences will place the series of MRLCs all in the low resistance state, which can be taken as either all "0" or all "1" and giving an effective logic of XOR or XNOR.

An example of using a series of four MRLCs to perform a XOR logic operation will be described. For this example, assume that the fixed magnetization orientation of each NRL 55P is designated as corresponding to a data bit=0 and that the coupling between CFL 51P and SRL 53P is antiferromagnetic. The input bit strings are:

X=x(1) . . . x(4)=0, 1, 0, 1
Y=y(1) . . . y(4)=1, 0, 0, 1

The inverted (NOT) bits for X will loaded into the corresponding CFL in the series of MRLCs and then the bits are inverted again when copied into the SRLs. This is a two step process:

Step (A): Set each CFL(1 . . . 4)=NOT(x(1 . . . 4));
Step (B): Set each SRL(1 . . . 4)=NOT(CFL(1 . . . 4)).

The result is that the SRLs contain the bits in X.
Next the bits for Y will be loaded into the corresponding CFL in the series of MRLCs:

Step (C): Set each CFL(1 . . . 4)=y(1 . . . 4).

Then the result is read with the low resistance state of the MRLCs corresponding to "0" and the high resistance state corresponding to "1".

The Tables 1-4 below track the states of the MRLCs and the operations for the XOR logic operation. A short negative (SN) pulse sets a CFL to anti-parallel to the NRL, which in this example sets CFL=1. Accordingly:

SN pulse sets CFL=1;
SP pulse sets CFL=0; and
LN pulse sets SRL=inverted copy of CFL.

The final resistance state of the MRLC(1 . . . 4)=High, High, Low, Low.

With the high resistance state interpreted as "1" then the result is:

0101 XOR 1001=1100

Alternatively, the high resistance state could be interpreted as "0" then the result is "0011" which is the XNOR output for the given inputs.

TABLE 1

| MRLC # | Step | Input Bit | Applied Pulse | CFL Contents | SRL Contents | Resistance State |
|---|---|---|---|---|---|---|
| MRLC-1 | A | 1 = $\overline{x(1)}$ | SN | 1 | ? | ? |
|  | B |  | LN | 1 | 0 | High = 1 |
|  | C | 1 = y(1) | SN | 1 | 0 | High = 1 |

TABLE 2

| MRLC # | Step | Input Bit | Applied Pulse | CFL Contents | SRL Contents | Resistance State |
|---|---|---|---|---|---|---|
| MRLC-2 | A | 0 = $\overline{x(2)}$ | SP | 0 | ? | ? |
|  | B |  | LN | 0 | 1 | High = 1 |
|  | C | 0 = y(2) | SP | 0 | 1 | High = 1 |

TABLE 3

| MRLC # | Step | Input Bit | Applied Pulse | CFL Contents | SRL Contents | Resistance State |
|---|---|---|---|---|---|---|
| MRLC-3 | A | 1 = $\overline{x(3)}$ | SN | 1 | ? | ? |
|  | B |  | LN | 1 | 0 | High = 1 |
|  | C | 0 = y(3) | SP | 0 | 0 | Low = 0 |

TABLE 4

| MRLC # | Step | Input Bit | Applied Pulse | CFL Contents | SRL Contents | Resistance State |
|---|---|---|---|---|---|---|
| MRLC-4 | A | 0 = $\overline{x(4)}$ | SP | 0 | ? | ? |
|  | B |  | LN | 0 | 1 | High = 1 |
|  | C | 1 = y(4) | SN | 1 | 1 | Low = 0 |

Switching of Embodiment with In-Plane Anisotropy

The switching operation of an MRLC 50H with the layer structure of FIG. 5 and in-plane easy axes will be described with reference to FIGS. 14 and 15. The top and bottom contacts have been omitted in these figures. The common free layer (CFL) 51H is set in the same way as described above for the perpendicular embodiment with a short positive (SP) pulse 61 or a short negative (SN) pulse 62. As previously described for the perpendicular anisotropy embodiment setting the switchable reference layer (SRL) 53H requires first setting the CFL 51H. Depending on the type of coupling between these two layers in MTJ-1, the SRL 53H will either be written as parallel or antiparallel to CFL 51H. In the special case, where SRL 53H is subjected to an effective ferromagnetic type coupling field from CFL 51H, then SRL 53H is set parallel CFL 51H. In this case the data bit copy is a direct copy. In a more typical case in an in-plane MTJ, the coupling field is mainly anti-ferromagnetic type magneto-static coupling, which results in SRL 53H being set to opposite magnetization direction to that of layer CFL 51H. In this case, the data bit copy is a "NOT" operation.

Figure 14:
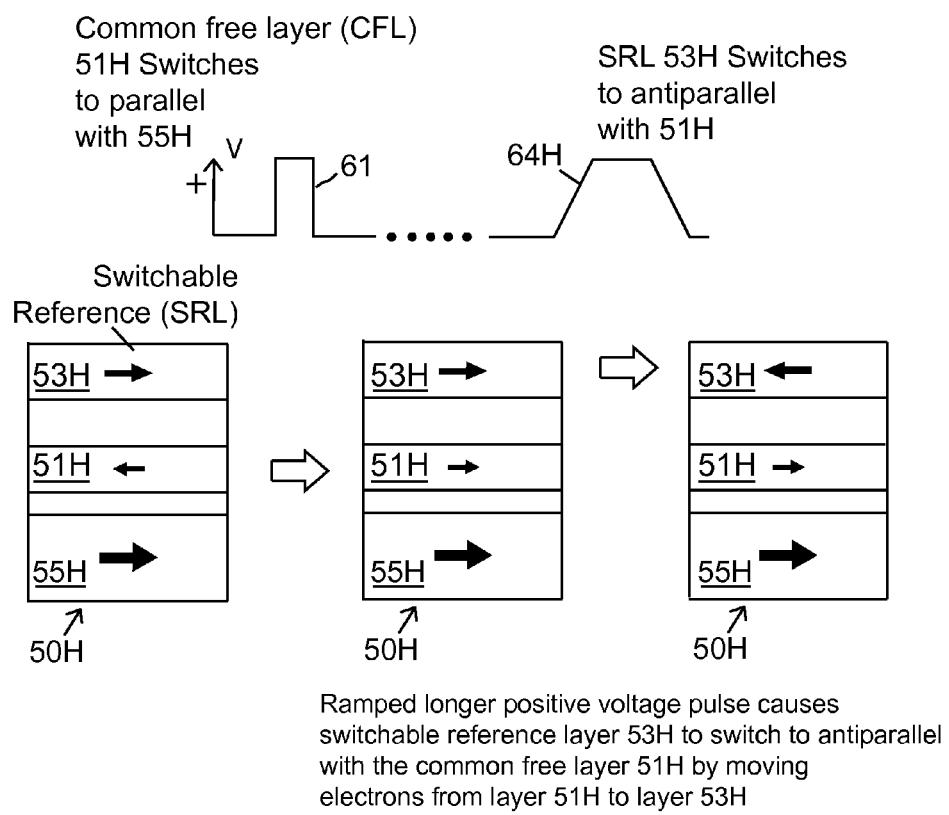
FIGS. 14 and 15 illustrate a process of setting the switchable reference layer (SRL) and the common free layer (CFL) in an MRLC according to an embodiment of the invention with in-plane anisotropy.

The example illustrated in FIG. 14 is the case where SRL 53H is set opposite to CFL 51H. In order to set the SRL 53H in this embodiment, an SP pulse 61 or a SN pulse 62 is applied first to switch CFL 51H into the opposite direction to the ultimate desired state for SRL 53H. In the initial state of the MRLC 50H shown on the left, the nonswitchable reference layer (NRL) 55H and the SRL 53H have the magnetization arrows pointing to the right. The arrow for CFL 51H pointing to the left. The target state for the SRL 53H will have its arrow pointing left, i.e., opposite to the NRL 55H. Accordingly a short positive (SP) pulse 61 is applied to switch CFL 51H parallel to NRL 55H. Next a high, long positive (LP) voltage pulse 64H is applied with rising and falling edges >10 ns. The positive polarity of the LP pulse 64H results in top contact having a positive potential. This leads to perpendicular anisotropy increasing in SRL 53H due to voltage on MTJ-1. Because there is an inverse relationship between the perpendicular and in-plane anisotropy contributions to the total system energy, increasing the perpendicular anisotropy results in lowering the in-plane anisotropy of the SRL 53H, which in turn makes the in-plane switching of the SRL 53H easier. This allows the coupling field to switch the magnetization SRL 53H. The inverse relationship between the perpendicular and in-plane anisotropy requires the use of a long positive pulse in the in-plane MRLC 50H embodiment to write the SRL 53H, while the perpendicular MRLC 50P embodiment uses a long negative pulse as previously described.

Figure 15:
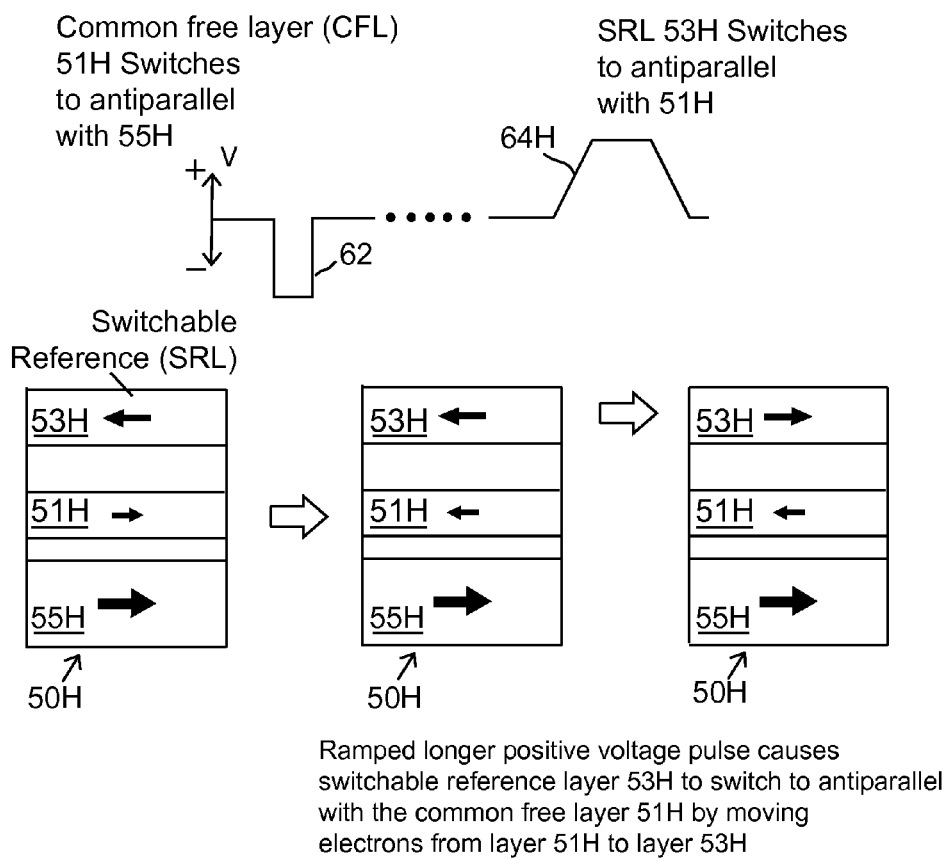

FIG. 15 illustrates an example where the initial orientation of CFL 51H is opposite to that of FIG. 14. So in this example a short negative (SN) pulse 62 is used first to set CFL 51H antiparallel to NRL 55H. The second step is applying a long positive (LP) pulse 64H the same as in FIG. 14.

In these examples an anti-ferromagnetic magneto-static coupling field, from CFL 51H to SRL 53H, results in SRL 53H switching to the opposite direction of CFL 51H when a long positive (LP) pulse 64H is applied. When the applied voltage pulse reduces to 0, the magnetization direction of SRL 53H is stable (fixed) in the new direction even if the coupling field subsequently reverses when CFL 51H is switched by a short pulse. This is because the in-plane anisotropy returns to static levels at which the coupling field will not switch SRL 53H.

Logic Operation of Embodiment with In-Plane Anisotropy

For logic operation of MRLC 50H the first step is to write a data bit to common free layer (CFL) 51H of MRLC 50H with a positive or negative short voltage pulse 61, 62 by STT effect through MTJ-2, as described above for the perpendicular anisotropy case. The pulse width is preferably <10 ns. Step 2 is to copy the written data bit in CFL 51H to SRL 53H of MTJ-1 with a second voltage pulse 64H by voltage effect across MTJ-1, where SRL 53H always has the positive potential of the voltage applied. The pulse rise and fall times of the second pulse 64H are longer than the pulse width of the first pulse 61, 62. SRL 53H switches due to coupling field from layer 51H. As noted if the coupling field is mainly anti-ferromagnetic type magneto-static coupling, SRL 53H switches to the opposite direction to that of CFL 51H and the data bit copy is a logical "NOT" operation. In case of an alternative embodiment where the effective coupling is ferromagnetic, SRL 53H switches parallel to CFL 51H, so in this case the data copy is a direct copy.

Step 3 is to write a new data bit to CFL 51H with a short voltage pulse 61, 62 as described. The polarity of pulse (positive or negative) determines the magnetization and, therefore, the value (0 or 1) of the data bit.

Reading the output data from the MRLC 50H is again by reading the high or low resistance state using a pulse that is selected not to switch either of the switchable layers. For example, the rise/fall time of the read-pulse should be greater than the short pulse that is used to write common free layer (CFL) 51H. As in the perpendicular anisotropy MRLC embodiment, the resistance of the MRLC 50H is dominated by the resistance of MTJ-1 due to the much higher RA of MTJ-1 than MTJ-2. Therefore, low resistance means the data bits are same (both 0 or both 1), high resistance means that the data bits are opposite values.

Materials for MRLC Layers

Except as described herein, the composition of the magnetic layers in both the perpendicular and in-plane embodiments are selected according to standard principles of MTJ design and do not need to have the same composition. Any or all of the magnetic layers can contain multi-ferroic material or show multi-ferroic behavior. Standard element(s) that can be included are Co, Fe, B, Ta, Ti, Ni, Pt, Pd, Cr, Cu, Mg, O, Hf, N, Cr, Mn, Zr, Ir, and Si.

The non-magnetic junction layer 52 is preferably designed to have an RA product of a minimum of 100 $\Omega\mu m^2$. This constraint can be achieved using a variety of materials according to standard principles. Standard element(s) that can be included in junction layers are Pt, Pd, Ru, Ta, Ti, Cr, Cu, Mg, Hf, Cr, Mn, Zr, Ir, Si, Au, Ag, Zn, and C. Exemplary embodiments include, but are not limited to, oxide layers of Mg, Al, Zn, Ta, Ti, Cu, and Cr.

The non-magnetic junction layer 54 is preferably designed to have an RA product equal to or less than 10% of the RA product of junction layer 52. This constraint can be achieved using a variety of materials according to standard principles. Exemplary embodiments include, but are not limited to:

a) an oxide of Mg, Al, Zn, Ta, Ti, Cu, Cr; or
b) a metal layer of Cu, Au, Ag; or
c) metal pillars in oxide matrix.

The design roles and constraints for the two junction layers 52, 54 are not identical, and therefore, the choice of materials used for each layer include some commonality but are not identical as described as above. The role of junction layer 52 in the design includes producing a large enough resistance change between MTJ states for data readout. In contrast the role of junction layer 54 is to switch the common free layer with STT and not for producing the readout signal. Thus, a low RA product MgO layer can work for junction layer 54. A Cu, Au, or Ag layer or a layer having pillars of these metals can also work for this purpose. These metals are usable for junction layer 54 because they provide good spin torque. However, these metals are not a good choice for junction layer 52, because they do not generate a large enough resistance change between MTJ states for data readout, and cannot serve as a good barrier to give rise to required capacitive effect.

MRLC Embodiment #2

Figure 8:
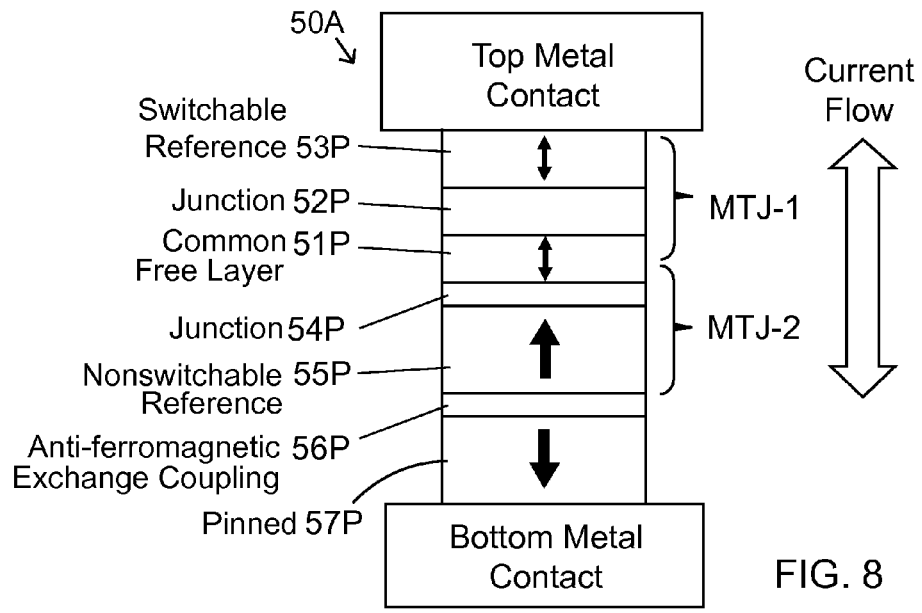
FIG. 8 illustrates the layer structure of an MRLC with perpendicular anisotropy according to a second embodiment of the invention.

Illustrated in FIG. 8

A second example of an magnetoresistive logic cell (MRLC) 50A device with a layer structure as shown in FIG. 8 will now be described. In this embodiment two additional layers are added to the structure of embodiment #1 and except for these additional layers the description above for embodiment #1 applies. As noted for embodiment #1 the entire structure can be flipped upside down as an alternative embodiment. In embodiment #2, anti-ferromagnetic exchange coupling layer 56P and magnetic pinned layer 57P are added below the nonswitchable reference layer (NRL) 55P. Embodiment #2 has an advantage over embodiment #1 because the additional magnetic field component generated by pinned layer 57P partially cancels out the magnetic field component from NRL 55P acting on common free layer 51P and switchable reference layer 53P. This reduces static coupling on the switchable layers 51P and 53P so that switching is less biased than in embodiment #1.

Anti-ferromagnetic (AF) exchange coupling layer 56P is designed according to standard principles to anti-ferromagnetically exchange couple magnetic pinned layer 57P and nonswitchable reference layer 55P. The anti-ferromagnetic exchange coupling layer 56P may also be replaced by a simple non-magnetic separation layer in the case where layer 55P intrinsic perpendicular anisotropy is large enough, where an exchange coupling field from 57P through layer 56P is not required to maintain 55P magnetization being anti-parallel to that of 57P. The composition of layer 56P can be, but is not limited to a) Ru, Cu; or b) a separation layer made of any metal or non-metal as long as it is nonmagnetic. Examples are Ta, Ti, Mg, Ir, Mn, Cu, Au, Ag, MgO, alumina, TiN, and TaN.

Magnetic pinned layer 57P is designed to have perpendicular anisotropy and be magnetized in the opposite orientation from nonswitchable reference layer 55P. Layer 57P need not be the same material as the other magnetic layers, but the same element/structure choices can be used as for magnetic common free layer 51P. In this embodiment, the structure is designed so that the combined magnetic field from layers 55P and 57P acting on common free layer 51P and switchable reference layer 53P is lower than the field from layer 55P alone. Common free layer 51P and switchable reference layer 53P can have coupling through magneto-static interaction or an exchange type coupling through junction layer 52P.

MRLC Embodiment #3

Figure 9:
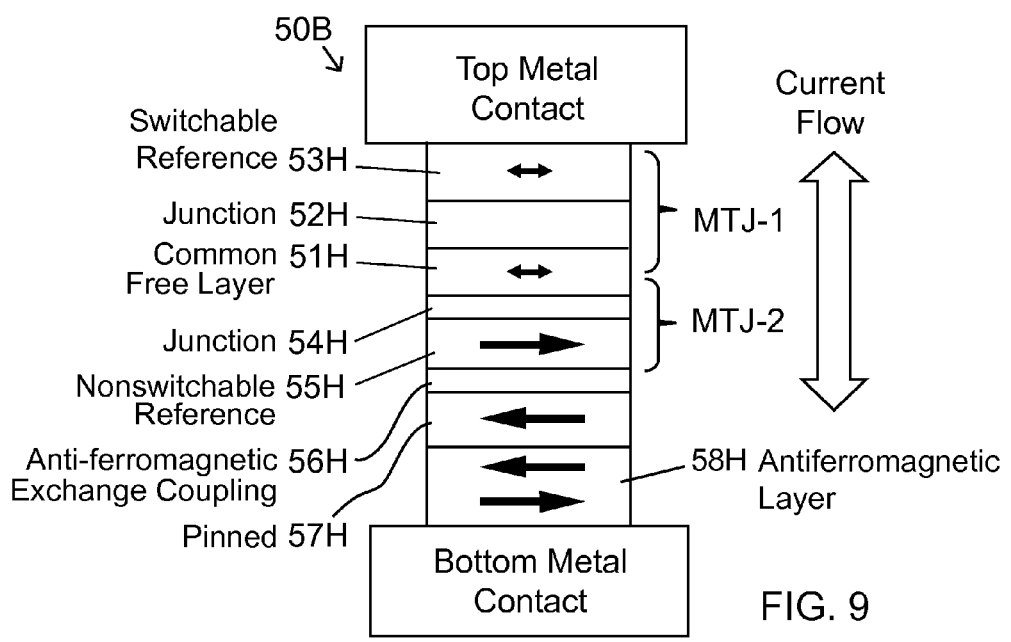
FIG. 9 illustrates the layer structure of an MRLC with in-plane anisotropy according to a third embodiment of the invention.

Illustrated in FIG. 9

A third example of a magnetoresistive logic cell (MRLC) 50B with a layer structure as shown in FIG. 9 will now be described. In this embodiment all of the magnetic layers have easy magnetization axes in the film plane, i.e. in-plane anisotropy. As for the previous embodiments, the entire layer structure can be flipped upside down as an alternative embodiment. Current flow is between the top and bottom contacts.

In embodiment #3, the function of the nonswitchable reference layer 55H is enhanced by adding anti-ferromagnetic (AF) exchange coupling layer 56H, magnetic pinned layer 57H, and anti-ferromagnetic layer 58H between nonswitchable reference layer 55H and the bottom contact. This 4-layer structure forms a generic reference & pinned layer structure which is known in the art for use in MRAM in-plane MTJs. The advantages for using this 4-layer structure in a conventional single MTJ MRAM device also apply to use in an in-plane MRLC according to the invention.

The non-magnetic junction layer 52H is preferably designed to have an RA product of a minimum of 100 $\Omega\mu m^2$. This constraint can be achieved using a variety of materials according to standard principles. Exemplary materials for junction layer 52H are oxides of Mg, Al, Zn, Ta, Ti, Cu, or Cr.

Magnetic switchable reference layer 53H need not be same material as common magnetic free layer 51H, but can be selected from the same element/structure choices as common magnetic free layer 51H. Magnetic layers 51H and 53H can have coupling through magneto-static interaction or exchange type coupling through layer 52H. Any or all of the magnetic layers 51H, 53H, 55H can contain multi-ferroic material or show multi-ferroic behavior.

The non-magnetic junction layer 54H is preferably designed to have an RA product equal to or less than 10% of the RA product of junction layer 52H. This constraint can be achieved using a variety of materials according to standard principles. Exemplary embodiments include, but are not limited to:

a) an oxide of Mg, Al, Zn, Ta, Ti, Cu, Cr; or
b) a metal layer of Cu, Au, Ag; or
c) metal pillars in oxide matrix.

Nonswitchable reference layer 55H serves as a magnetic pinned layer and can have the same element/structure choices as magnetic common free layer 51H, but the pinned layer need not be the same material as the free layer. Anti-ferromagnetic (AF) exchange coupling layer 56H is designed according to standard principles to anti-ferromagnetically exchange couple magnetic pinned layer 57H and nonswitchable reference layer 55H. AF-exchange coupling layer 56H can be, but is not limited to Ru or Cu. Magnetic pinned layer 57H need not be the same material as common free layer 51H, but the same element/structure choices can be used.

Materials for anti-ferromagnetic layer 58H can be selected according to standard principles. Exemplary materials that can be included in composition are Ir, Mn, Pt, Pd, Fe, and Rd. The materials IrMn or PtMn are preferable.

Although the present invention has been described in terms of specific embodiments, it is anticipated that alterations and modifications thereof will no doubt be apparent to those skilled in the art. It is therefore intended that the following claims be interpreted as covering all such alterations and modifications as fall within the true spirit and scope of the invention.

The invention claimed is:

1. A magnetoresistive logic cell (MRLC) comprising:
a first magnetic tunnel junction (MTJ-1) formed by a first reference layer, a first junction layer and a free layer a magnetization direction of the first reference layer being switchable by application of a first voltage pulse to the MRLC to be parallel to the free layer magnetization direction, which is unchanged by said first pulse;
a second magnetic tunnel junction (MTJ-2) formed by the free layer, a second junction layer and a second reference layer, MTJ-2 having a substantially lower resistance than MTJ-1, the magnetization direction of the free layer being switchable to be parallel or antiparallel to the magnetization direction of the second reference layer by application of either a second or a third voltage pulse to the MRLC that leaves the magnetization direction of the first reference layer unchanged; and
MTJ-1 and MTJ-2 being in series.

2. The magnetoresistive logic cell (MRLC) of claim 1 wherein MTJ-1 having a first resistance-area product and a first effective capacitance, the MTJ-2 having a second resistance-area product and a second effective capacitance with the second resistance-area product being substantially lower than the first resistance-area product and the second effective capacitance being substantially lower than the first effective capacitance.

3. The magnetoresistive logic cell (MRLC) of claim 1 wherein a magnetic coupling field strength between the first reference layer and the free layer being insufficient to switch magnetization direction of either the first reference layer or the free layer under static conditions, the magnetization direction of the first reference layer being switchable to parallel the direction of the magnetic coupling field from the free layer when the first voltage pulse having a duration longer than 10 ns, with a gradual rise and fall time is applied to the first and second MTJs, the selected long duration voltage pulse leaving the magnetization direction of the free layer unchanged.

4. The magnetoresistive logic cell (MRLC) of claim 1 wherein the second voltage pulse and the third voltage pulse have a duration less than a duration of said first voltage pulse.

5. The magnetoresistive logic cell (MRLC) of claim 1 wherein the free layer is switched with reference to the second reference layer by spin-transfer torque (STT) effect.

6. A magnetoresistive thin film structure with first and second magnetic tunnel junctions (MTJs) comprising:
the first and second MTJs in series, the first MTJ having a first resistance-area product and a first effective capacitance, the second MTJ having a second resistance-area product and a second effective capacitance with the second resistance-area product being lower than the first resistance-area product and the second effective capacitance being lower than the first effective capacitance;
the first MTJ being formed by a first reference layer of magnetic material, a first junction layer of nonmagnetic material and a free layer of magnetic material, the first reference layer and the free layer having first and second switchable magnetization directions, a magnetic coupling field strength between the first reference layer and the free layer being insufficient to switch magnetization direction of either the first reference layer or the free layer under static conditions, the magnetization direction of the first reference layer being switchable between first and second magnetization directions by the magnetic coupling field from the free layer when a selected long duration voltage pulse with a gradual rise and fall time is applied to the first and second MTJs, the selected long duration voltage pulse leaving the magnetization direction of the free layer unchanged; and
the second MTJ being formed by the free layer, a second junction layer of nonmagnetic material and a second reference layer of magnetic material, the second reference layer having a fixed magnetization direction, the magnetization direction of the free layer being switchable between first and second magnetization directions by spin transfer torque (STT) effect from the second reference layer through the second junction layer by application of a selected positive or negative short duration voltage pulse with a short rise time, where the selected short duration voltage pulse leaves the magnetization direction of the first reference layer unchanged.

* * * * *